United States Patent [19]

Galani

[11] Patent Number: 4,692,714
[45] Date of Patent: Sep. 8, 1987

[54] SINGLE RESONATOR PUSH-PUSH OSCILLATOR

[75] Inventor: Zvi Galani, Bedford, Mass.

[73] Assignee: Raytheon Company, Lexington, Mass.

[21] Appl. No.: 920,403

[22] Filed: Oct. 20, 1986

[51] Int. Cl.⁴ .......................... H03B 5/18; H03L 7/02
[52] U.S. Cl. .................................... 331/1 R; 331/56; 331/96; 331/100
[58] Field of Search .................. 331/56, 96, 100, 102, 331/107 P, 117 D, 114, 46, 116 R, 166 FE, 117 R, 117 FE, 159, 168, 158, 167, 1 R

[56] References Cited

U.S. PATENT DOCUMENTS

| | | | |
|---|---|---|---|
| 3,293,562 | 12/1966 | Hahnel | 331/56 |
| 3,993,962 | 11/1976 | Hopwood et al. | 331/18 |
| 4,083,016 | 4/1978 | Zangrando et al. | 331/56 |
| 4,344,185 | 8/1982 | Cook et al. | 455/110 |
| 4,527,130 | 7/1985 | Lütteke | 331/100 X |
| 4,555,678 | 11/1985 | Galani et al. | 331/1 A |
| 4,565,979 | 1/1986 | Fiedziuszko | 331/117 D |
| 4,570,132 | 2/1986 | Driscoll | 331/56 |

OTHER PUBLICATIONS

"A 20–40–GHz Push–Push Dielectric Resonator Oscillator", A. M. Pavio and M. A. Smith, IEEE Transactions on Microwave Theory and Techniques, vol. MTT-33, No. 12, Dec. 1985, pp. 1346–1349.
"A Study of Locking Phenomena in Oscillators", R. Adler, Proceedings of the IEEE, vol. 61, No. 10, Oct. 1973, pp. 1380–1385.

Primary Examiner—Siegfried H. Grimm
Attorney, Agent, or Firm—David J. Thibodeau; Richard M. Sharkansky; Philip J. McFarland

[57] ABSTRACT

A microwave frequency oscillator utilizing a push-push configuration to provide a low noise highly stable output signal at twice the frequency of a single resonator. The single resonator is connected in the feedback loop of two amplifiers. Additional circuit elements insure the proper oscillation conditions and relative phase are maintained. The use of a single resonator makes possible the application of various noise reduction techniques.

6 Claims, 2 Drawing Figures

SINGLE RESONATOR PUSH-PUSH OSCILLATOR

BACKGROUND OF THE INVENTION

This invention relates to solid state microwave frequency oscillators, and in particular to a push-push oscillator having a single resonator.

Frequency doubling oscillators are primarily used for signal generation at microwave frequencies above the highest operating frequency of available transistors. It is known that one way to construct a frequency doubling oscillator is by using the push-push concept. Such a push-push oscillator consists of two separate oscillator circuits, each operating at a frequency $f_o/2$. The output signal for each oscillator is fed to a common node for summation. If the oscillator outputs are maintained at a relative phase difference of 180° C., and also have a second harmonic frequency component at $f_o$, a signal at frequency $f_o$ with a substantially reduced frequency component at $f_o/2$ will be present at the common node. This occurs because the two fundamental frequency components at $f_o/2$ are 180° out of phase, but the two second harmonic components at $f_o$ are in phase. The oscillator output signals' relative phase is maintained at 180° by a suitably designed output load circuit which prevents in phase oscillation at $f_o/2$ and provides the necessary conditions for out of phase oscillation at $f_o/2$ The free running frequencies of the two oscillators are not identical because of tolerances in their respective circuit component values. However, a phenomenon known as injection locking takes place and can be used to insure that the frequencies of the two oscillators are locked to each other. The injection locking phenomenon is described in an article by Adler, R., entitled "A Study of Locking Phenomena in Oscillators", in *Proceedings of the IEEE,* Volume 61, Number 10, October 1973, pp 1380–1385. According to this article, the maximum frequency range over which injection lock can occur is inversely proportional to the external Q of the oscillators. Therefore, in the case of oscillators having low values of external Q, injection locking occurs even with a large discrepancy in their free running frequencies. Push-push oscillators are therefore characterized by low external Q values, in the range of 10–100.

Another treatment of injection locking is presented in an article by Kurokawa, K., entitled "Injection Locking of Microwave Solid-State Oscillators", in *Proceedings of the IEE,* Volume 61, Number 10, October 1973, pp 1386–1410.

It is also known that the frequency modulated (FM) noise of any free running oscillator is inversely dependent upon the external Q of its circuit. Consequently, the use of known push-push oscillators in applications requiring low FM noise has heretofore been precluded by the low external Q required in such oscillators for injection locking. That is to say, if injection locking is incorporated in a push-push oscillator of a known type and, at the same time FM noise is to be reduced to a minimum, impractically tight limitations on component tolerances are required.

SUMMARY OF THE INVETNION

With this background of the invention in mind it is therefore an object of this invention ot provides an improved microwave frequency push-push oscillator.

It is another object of this invention to provide two frequency locked signals from a single high Q resonator, the two signals having a relative phase of 180°.

It is a further object of this invention to provide a push-push microwave oscillator with the capability of adapting to various noise reduction techniques.

The foregoing and other objects are achieved in a circuit containing two feedback type oscillators arranged to share a common resonator, with the outputs of the two oscillators being connected together at a common node. This arrangement insures frequency lock of the two oscillators and readily avails itself to the application of noise reduction techniques commonly applied to single resonator feedback oscillators.

BRIEF DESCRIPTION OF THE DRAWING

The foregoing and other objects, advantages, and novel features of this invention become more evident from the following detailed description when considered together with the accompanying drawings wherein.

DESCRIPTION OF THE PREFERRED EMBODIMENT

Figure 1:
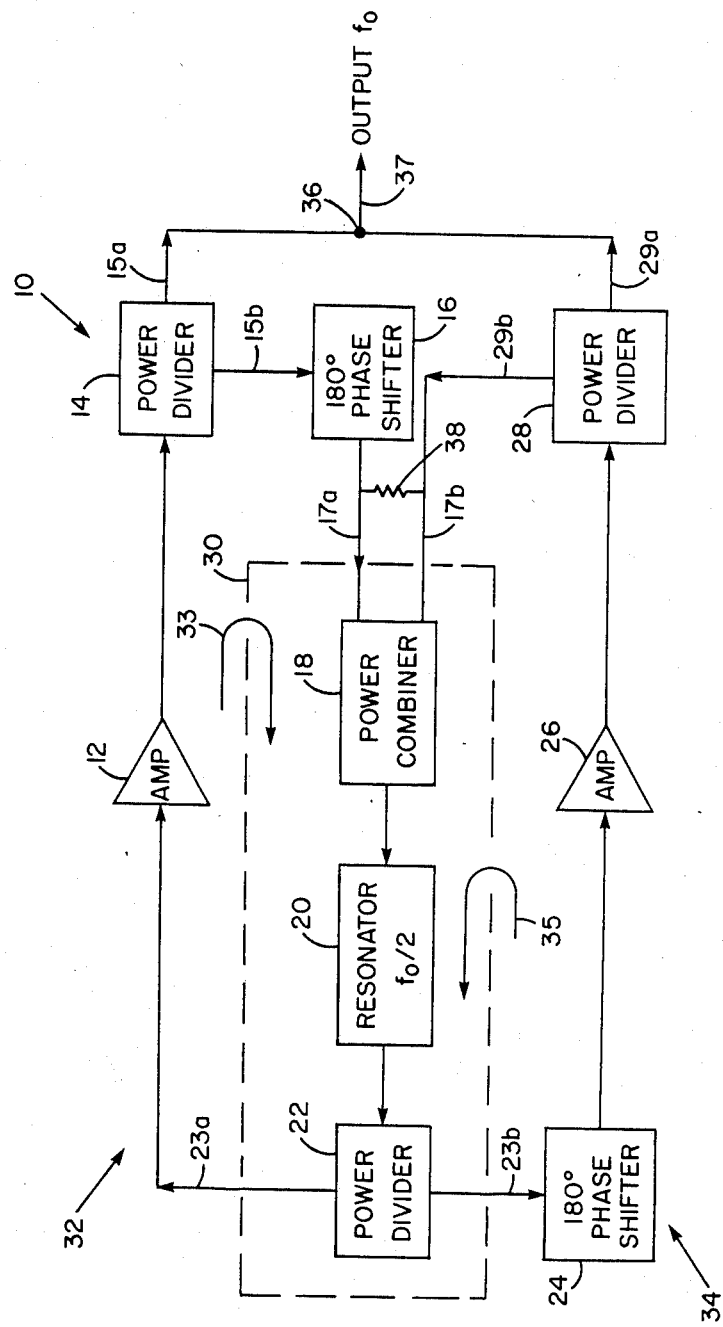
FIG. 1 is a block diagram of a low noise push-push microwave oscillator according to this invention.

Turning attention now to the drawings, in which like reference characters indicate like or corresponding parts throughout the several views, there is shown in FIG. 1 a push-push microwave oscillator 10 in accordance with the present invention. Microwave oscillator 10 is seen to comprise a first microwave frequency amplifier 12, such as a gallium arsenide field effect transistor or the like, a first power divider 14, a first 180° phase shifter 16, a power combiner 18, a resonator 20, a second power divider 22, a second 180° phase shifter 24, a second microwave frequency amplifier 26, and a third power divider 28. More particularly, push-push oscillator 10 comprises a first oscillator circuit 32 and a second oscillator circuit 34 sharing a common resonant feedback circuit 30. Each one of the oscillator circuits 32, 34 operates at the same frequency, $f_o/2$, where $f_o$ is the desired output frequency of microwave oscillator 10. The output of the first oscillator circuit 32 is available at output port 15a of the first power divider 14. The output of the second oscillator circuit 34 is available at output port 29a of the third power divider 28. The two oscillator outputs 15a and 29a are combined at a node 36 equidistant from power dividers 14 and 28 to produce an output signal 37 with a frequency $f_o$.

The common feedback circuit 30 comprises power combiner 18, resonator 20 and first power divider 22. Power combiner 18 is arranged to receive a first resonator input signal at a first input 17a and a second resonator input signal at a second input 17b. The output of power combiner 18 in turn is fed to resonator 20. Resonator 20 is preferably characterized by high loaded Q and is resonant at a frequency $f_o/2$. Dielectric resonators are readily available having loaded Q's greater than 2,000 at X-band frequencies. Resonator 20 may also be embodied as a Yttrium Iron Garnet (YIG) filter or as a mechanically or electronically tuned cavity. The output of resonator 20 is fed to second power divider 22. It is the function of the second power divider 22 to provide a first and second resonator output signal to be fed to the first oscillator circuit 32 and the second oscillator circuit 34, repectively. Second power divider 22 in conventional fashion equally divides the power of the resonator output between its first and second output ports 23a and 23b.

More particularly, the first oscillator circuit 32 is seen to comprise a first amplifier 12 and its associated first feedback circuit comprising a signal path (indicated by arrow 33) through first amplifier 12, first power divider 14, first 180° phase shifter 16, through the resonant circuit (comprising power combiner 18, resonator 20, and power divider 22) via the first input port 17a of power combiner 18 and the first output port 23a of power divider 22. The second oscillator circuit 34 is seen to comprise second amplifier 26 and its second feedback circuit (indicated by arrow 35) including the signal path through third power divider 28, the resonant circuit via the second intput port 17b of power combiner 18, resonator 20 and second output port 23b power divider 22, and through the second 180° phase shifter 24. Oscillation at frequency $f_o/2$ will commence in each oscillator circuit if, at that frequency, the small signal gain of its amplifier exceeds the insertion loss of its feedback circuit, and if the open loop insertion phase of each circuit is equal to an integer multiple of $2\pi$ radians.

As previously mentioned, push-push oscillator 10 operates because the output of the first oscillator circuit 32 is maintained at the same frequency by 180° out of phase with respect to the output 29a of second oscillator circuit 34. Because the oscillators share a common resonator, injection lock is easily achieved. However, in order for each oscillator circuit to also meet the condition for oscillation at frequency $f_o/2$, the signals at the input ports 17 a and 17b of the power combiner 18 must be in phase. It is the function of the first and second 180° phase shifters 16 and 24 to maintain the proper signal phasing in the oscillator circuits and to maintain a relative phase shift of 180° between the outputs of the two oscillators. Therefore, by setting the small signal gain of the two aplifiers 12 and 26 to exceed the insertion loss of their respective feedback circuits and by insuring that the electrical length of the two feedback circuits is identical and equal to an integer multiple of $2\pi$ radians, oscillation with proper phasing will occur in each circuit at the desired frequency. Phase shifters 16 and 24 are preferrably embodied as variable phase shifters to compensate for discrepancies in the insertion phases of the two amplifiers and feedback circuits.

That the proper phase relationship will be maintained can also be understood by considering that when the two resonator input signals 17a and 17b of power combiner 18 are in phase they are combined with a low associated insertion loss. Out of phase oscillation will not be supported at this point as this is a high insertion loss condition. Thus, because the in phase relationship is supported at the input to power combiner 18, the output signal 15a first oscillator circuit 32 necessarily must be 180° out of phase with respect to the output signal 29a of second oscillator circuit 34 because of 180° phase shifter 16.

Resonator 20 may be embodied as a single frequency resonant circuit such as a dielectric resonator and 180° phase shifters 16 and 24 as pieces of transmission line having the proper length to provide a 180° shift at frequency $f_o/2$. However, if resonator 20 is embodied as a tunable resonator such as a YIG filter, and oscillator 10 is to operate over a relatively wide frequency range, 180° phase shifters 16 and 24 must provide the proper phase shift over this operating frequency range. However, some tolerance in phase shifters 16 and 24 is acceptable as long as the total delay in each feedback circuit remains about the same. A more noticeable effect will be in the output signal at node 36, where the component at $f_o/2$ will be stronger due to less effective cancellation at that node.

So, with the proper phase relationship maintained between output signals 15a and 29a, the output of push-push oscillator 10 at node 36 will be a signal having a frequency component at $f_o$, because the components at $f_o/2$ will either cancel or be substantially reduced. In order to generate sufficient power at the output frequency $f_o$, amplifiers 12 and 26 are operated in a gain compression mode, thereby generating a high level of distortion and harmonic content in their outputs. Power dividers 14 and 28 must in turn be sufficiently broadband in order to avoid attenuation before the two oscillator signals are combined at node 36. Power dividers 14 and 28 are chosen so as to match the particular application for oscillator 10, trading off the power directed to feedback circuits 15b and 29b for better low noise performance against the desired power levels of output signals 15a and 29a.

Optionally, an isolation resistor 38 may be disposed across the inputs 17a and 17b of power combiner 18. This provides a signal leakage path between the two oscillator circuits in addition to the path through node 36. The purpose of this isolation resistor 38 is to improve injection locking of the two oscillators.

Figure 2:
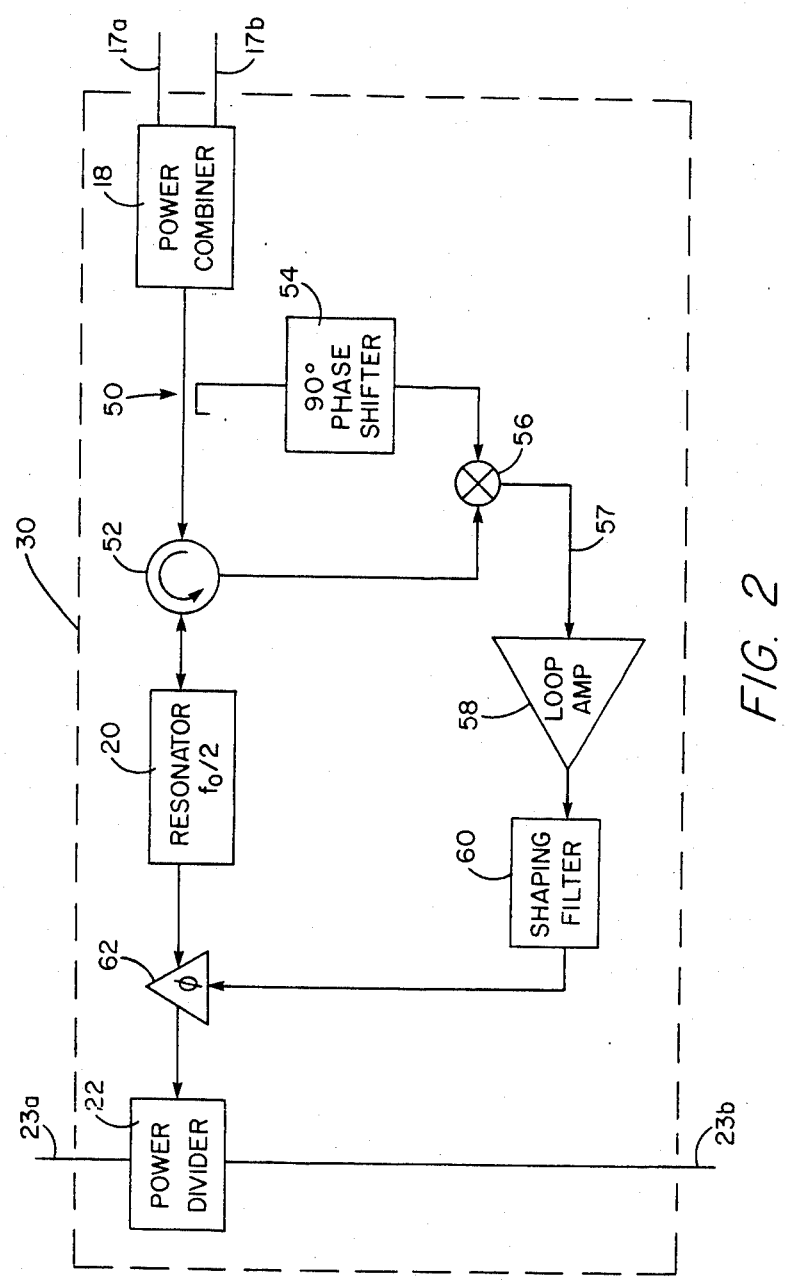
FIG. 2 is a block diagram of a preferred noise degeneration circuit as applied to the microwave oscillator according to this invention.

It has thus been seen how the advantages of a high Q resonator may be combined with the advantages of a push-push oscillator in a manner not previously thought possible. Various frequency stabilization techniques such as a frequency-locked loop at $f_o/2$ or $f_o$ using a second resonator or delay line in a discriminator may be used to degenerate the oscillator FM noise. One advantage of the single resonator push-push oscillator described above is that the resonator itself can also be used in a discriminator in a manner similar to that disclosed in U.S. Pat. No. 4,555,678 to Galani, et al. As shown in FIG 2., common feedback circuit 30 may be arranged for noise degeneration. As in FIG. 1, the first and second resonator input signals are fed to first and second inputs 17a and 17b of power combiner 18. In the noise degeneration arrangement, however, the output of power combiner 18 is fed to circulator 52 as well as 90° phase shifter 54 via coupler 50. The outputs of circulator 52 and 90° phase shifter 54 are fed to phase detector 56. The resonator 20 (thus operating in the reflection mode), circulator 52, coupler 50, 90° phase shifter 54, and phase detector 56 comprise a discriminator. The output of mixer 56 is amplified by loop amplifier 58 and filtered by shaping filter 60. The output of shaping filter 60 is applied to the control port of voltage controlled phase shifter 62 which serves as the fine tuning port of the oscillator.

Having described a preferred embodiment of the invention, numerous variations may now become apparent to those skilled in the art. For example, alternative arrangements of power dividers and phase shifters may be used to provide the requisite in-phase relationship between the signals fed to power combiner 18, while providing the out of phase relationship between the signals combined at node 36. Additionally, first power divider 14 and first 180° phase shifter 16 may be replaced by a component commonly known as a 180° hybrid coupler, arranged to receive a single input from the first amplifier 12 while maintaining a 180° phase relationship between its two outputs, one fed to power combiner 18 and the other fed to node 36. Similarly, second power divider 22 and second 180° phase shifter 24 may be replace by a 180° hybrid coupler. Also, the position in the loop 34 of 180° phase shifter 24 could be after amplifier 26. A circuit known as a Wilkinson-type two way combiner/divider comprising two strips of one-quarter wavelength transmission line and a shunt resistor may be used for both the power divider 22 and power combiner 18. Also, rather than operate amplifiers 12 and 26 in gain compression mode, second harmonics at $f_o$ can be enhanced by a suitable design of their circuits. It is felt therefore, that this invention should no be limited in scope to the particular embodiment shown and described above, but only by the spirit and the scope of the claims that follow.

What is claimed is:

1. A microwave push-push oscillator utilizing first and second active amplifying elements, each amplifying element having a feedback loop and an output, comprising:
   (a) a resonator;
   (b) first means for connecting said resonator in the feedback loop of siad first amplifying element;
   (c) second means for connecting said resonator in the feedback loop of said second amplifying element; and
   (d) means for maintaining a 180° phase relationship between the output of said first and said second amplifying elements.

2. A microwave frequency oscillator, generating as outputs a first signal with a fundamental frequency of $f_o/2$ and a second signal also with a fundamental frequency $f_o/2$, comprising:
   (a) means for resonating at a frequency $f_o/2$, having first and second inputs and first and second outputs;
   (b) first amplifier means having an input and output, the first amplifier means input operably connected to the first resonator means output and the first amplifier means output operably connected to the first resonator means input, for providing the first signal;
   (c) second amplifier means, having an input and output, the second amplifier means input operably connected to the second resonator means output and the second amplifier means ouput operably connected to the second resonator means input, for providing the second signal; and
   (d) means for maintaining the phase of the first and second signals at 180° with respect to each other.

3. An oscillator as in claim 2 wherein an oscillator output signal at a frequency $f_o$ is also provided, and additionally comprising:
   (e) means, connected to receive the first signal and the second signal, for providing the oscillator output signal at a frequency $f_o$.

4. An oscillator for providing an output signal having a frequency component at $f_o$ comprising:
   (a) first amplifying means, having an input, an output, and a particular small signal gain, for providing a first signal;
   (b) second amplifying means, having an input, an output, and a particular small signal gain, for providing a second signal;
   (c) frequency determining means having first and second inputs and first and second ouputs, the frequency determining means first input connected to the first amplifier output, the frequency determining means second input connected to the second amplifier output, the frequency determining means first output connected to the first amplifier input and the frequency determining means second output connected to the second amplifier input, for providing an insertion loss less than both the first and second amplifier small signal gain when the first and second signals are 180° out of phase and an insertion loss exceeding the first and second amplifier small signal gain when the first and second signals are not substantially 180° out of phase; and
   (d) injection locking means, connected to receive the first and second signals, for providing the output signal with a frequency component at $f_o$.

5. An oscillator as in claim 4 and additionally comprising:
   (e) discrimination means, responsive to the first and second inputs of said resonator means, for providing a signal indicative of amplifier noise; and
   (f) means, connected to receive the signal indicative of amplifier noise, for degenerating amplifier noise.

6. An oscillator as in claim 4 wherein said frequency determining means comprises:
   (i) combining means, responsive to the first amplifying means output and the second amplifying means output, for providing a power combined signal; and
   (ii) resonator means, fed by the power combined signal, for resonating at a frequency $f_o/2$, and having an output; and
   (iii) power dividing means, responsive to the resonator means output, for providing both the first and second frequency determining means outputs.

* * * * *